(12) United States Patent
Ling et al.

(10) Patent No.: US 12,189,139 B2
(45) Date of Patent: Jan. 7, 2025

(54) NEAR-EYE DISPLAY APPARATUS AND DISPLAY METHOD THEREFOR

(71) Applicant: BOE TECHNOLOGY GROUP CO., LTD., Beijing (CN)

(72) Inventors: Qiuyu Ling, Beijing (CN); Wei Wang, Beijing (CN); Tiankuo Shi, Beijing (CN); Yifan Hou, Beijing (CN); Xianqin Meng, Beijing (CN); Weiting Peng, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/570,138

(22) PCT Filed: Jun. 18, 2021

(86) PCT No.: PCT/CN2021/100907
§ 371 (c)(1),
(2) Date: Dec. 14, 2023

(87) PCT Pub. No.: WO2022/261940
PCT Pub. Date: Dec. 22, 2022

(65) Prior Publication Data
US 2024/0272335 A1    Aug. 15, 2024

(51) Int. Cl.
*G02B 3/00* (2006.01)
*G09G 3/3225* (2016.01)
(Continued)

(52) U.S. Cl.
CPC ......... *G02B 3/0056* (2013.01); *G09G 3/3225* (2013.01); *H10K 59/879* (2023.02);
(Continued)

(58) Field of Classification Search
None
See application file for complete search history.

(56) References Cited

U.S. PATENT DOCUMENTS

| | | | | |
|---|---|---|---|---|
| 2008/0239499 A1* | 10/2008 | Fukuda | ............. | H01L 27/14627 359/619 |
| 2015/0049390 A1* | 2/2015 | Lanman | ................. | G09G 3/003 359/622 |
| 2022/0269082 A1* | 8/2022 | Huang | .................. | G02B 5/003 |

FOREIGN PATENT DOCUMENTS

| CN | 109581678 A | 4/2019 |
|---|---|---|
| CN | 109709675 A | 5/2019 |

(Continued)

*Primary Examiner* — Stephen T. Reed
(74) *Attorney, Agent, or Firm* — HOUTTEMAN LAW LLC

(57) ABSTRACT

A near-eye display apparatus, including: a display screen including pixel island groups each including at least one pixel island which each includes pixel units; a micro-lens array disposed on a light-emitting side of the display screen, and including micro-lenses each corresponding to one pixel island, each micro-lens being configured for imaging an image displayed by the pixel island corresponding thereto; an imaging lens group disposed on a side of the micro-lens array away from the display screen and configured for collimating imaging light of the micro-lenses, the pixel island groups are configured for displaying partial images which form a complete image, and imaging field of view angles formed by outgoing light rays, of the pixel island groups adjacent to each other, passing through the micro-lenses corresponding to the pixel island groups and the imaging lens group are continuous with each other. A display method is further provided.

20 Claims, 11 Drawing Sheets

(51) Int. Cl.
*H10K 59/80* (2023.01)
*G02B 27/01* (2006.01)
*H10K 59/35* (2023.01)

(52) U.S. Cl.
CPC ... *G02B 27/0172* (2013.01); *G09G 2320/028* (2013.01); *H10K 59/351* (2023.02); *H10K 59/353* (2023.02)

(56) References Cited

FOREIGN PATENT DOCUMENTS

| | | |
|---|---|---|
| CN | 110459577 A | 11/2019 |
| CN | 110488494 A | 11/2019 |
| CN | 110941092 A | 3/2020 |
| CN | 111638600 A | 9/2020 |
| EP | 0627644 A2 | 12/1994 |
| WO | WO2020113428 A1 | 6/2020 |

* cited by examiner

NEAR-EYE DISPLAY APPARATUS AND DISPLAY METHOD THEREFOR

TECHNICAL FIELD

The present disclosure relates to the field of near-eye display technology, and in particular, relates to a near-eye display apparatus and a display method therefor.

BACKGROUND

With the continuous development of near-eye display technology, near-eye display products are widely applied to civil fields such as film and television, education, and medical treatment from the beginning of being applied in military fields. Technologies currently used for near-eye displays are virtual reality technologies and augmented reality technologies.

The display resolution of the current near-eye display equipment is relatively not high and cannot meet practical expectations due to the limitation of the overall thickness of the near-eye display equipment and the precision of processes for manufacturing a display screen.

SUMMARY

In a first aspect, an embodiment of the present disclosure provides a near-eye display apparatus, which includes: a display screen for displaying an image, the display screen including a plurality of pixel island groups, each pixel island group including at least one pixel island, and each pixel island including a plurality of pixel units; a micro-lens array disposed on a light-emitting side of the display screen, the micro-lens array including a plurality of micro-lenses, each micro-lens corresponding to one pixel island and being configured for imaging the image displayed by the pixel island corresponding thereto; and an imaging lens group disposed on a side of the micro-lens array away from the display screen and configured for collimating imaging light of the micro-lens, the pixel island groups are configured for displaying partial images respectively, the partial images displayed by the pixel island groups form a complete image, and imaging field of view angles formed by outgoing light rays, of the pixel island groups adjacent to each other, passing through the micro-lenses corresponding thereto and the imaging lens group, are continuous with each other.

In some implementations, a distance between the pixel island and the micro-lens corresponding to the pixel island is less than a focal length of the micro-lens, and the image displayed by the pixel island corresponding to the micro-lens is imaged at a focal point of the imaging lens group.

In some implementations, colors of the pixel units in each pixel island are the same, colors of the pixel units in different pixel islands in each pixel island group are different, and imaging field of view angles formed by outgoing light rays, of the pixel islands including the pixel units with a same color, passing through the micro-lenses corresponding thereto and the imaging lens group are continuous with each other.

In some implementations, an intersection exists between imaging field of view angles formed by outgoing light rays, of the pixel islands adjacent to each other in each pixel island group, passing through the micro-lenses corresponding thereto and the imaging lens group.

In some implementations, the number of the pixel islands included in each pixel island group is the same, and imaging field of view angles formed by outgoing light rays, of the pixel island groups, passing through the micro-lenses corresponding thereto and the imaging lens group are the same in size.

In some implementations, an intersection between the imaging field of view angles of the pixel islands adjacent to each other in each pixel island group is a half of the imaging field of view angle of one pixel island.

In some implementations, two pixel islands adjacent to each other in each pixel island group are a first pixel island and a second pixel island respectively, the first pixel island displays a first image and the second pixel island displays a second image, a field of view angle corresponding to the first image is a first field of view angle, a field of view angle corresponding to the second image is a second field of view angle, a size of the first field of view angle is equal to a size of the second field of view angle, and the second field of view angle is obtained by shifting the first field of view angle along a preset direction by a half of the first field of view angle, and the preset direction is an arrangement direction along which the first pixel island and the second pixel island are arranged.

In some implementations, each pixel island group includes: a blue pixel island, a red pixel island, a first green pixel island and a second green pixel island, each pixel unit in the blue pixel island is blue, each pixel unit in the red pixel island is red, and each pixel unit in the first green pixel island and the second green pixel island is green, the blue pixel island, the red pixel island, the first green pixel island and the second green pixel island are arranged into a square array with two rows and two columns, the blue pixel island and the red pixel island are located on one diagonal of the square array, and the first green pixel island and the second green pixel island are located on the other diagonal of the square array.

In some implementations, the pixel units in each pixel island are arranged in an array, each pixel unit is rectangular, and a preset included angle is formed between an edge of each pixel unit and an arrangement direction along which the pixel units in each row are arranged.

In some implementations, the preset included angle is about 45°.

In some implementations, the pixel islands are the same in shape and size, and the micro-lenses are the same in shape and size.

In some implementations, each micro-lens is one of a geometric lens, a super-lens, or an optical diffractive lens.

In some implementations, the display screen is a silicon-based organic-light-emitting-diode display screen.

In some implementations, the number of the pixel units included in each unit area of the display screen ranges from 2000 to 3000.

In some implementations, the imaging lens group includes at least one lens, a surface shape of the lens in the imaging lens group is one of a spherical surface, an aspherical surface, a free-form surface or a super surface.

In some implementations, the near-eye display apparatus further includes a transparent substrate disposed between the display screen and the micro-lens array, and the micro-lens array is disposed on a surface of the transparent substrate away from the display screen.

In some implementations, a material of the transparent substrate is one of silicon nitride or polymethyl methacrylate.

In some implementations, the micro-lens array is located on a surface of the display screen on a light-emitting side thereof.

In a second aspect, an embodiment of the present disclosure provides a display method for a near-eye display apparatus, including: determining an imaging field of view angle corresponding to each pixel island group in a display screen; and loading image data in the imaging field of view angle to the pixel island group corresponding to the imaging field of view angle.

In some implementations, the pixel island group includes at least a first pixel island and a second pixel island which are adjacent to each other, colors of pixel units in the first pixel island are the same, colors of pixel units in the second pixel island are the same, and the colors of the pixel units in the first pixel island and the second pixel island are different, an imaging field of view angle corresponding to the first pixel island is a first field of view angle, an imaging field of view angle corresponding to the second pixel island is a second field of view angle, and the loading image data in the imaging field of view angle to the pixel island group corresponding to the imaging field of view angle includes: applying image data in a first field of view angle to the first pixel island in the pixel island group; applying image data in a second field of view angle to the second pixel island in the pixel island group, the second field of view angle is obtained by shifting the first field of view angle by a half of the first field of view angle along a preset direction, and the preset direction is an arrangement direction along which the first pixel island and the second pixel island are arranged.

DESCRIPTION OF DRAWINGS

In order to more clearly illustrate the technical solutions of the embodiments of the present disclosure, the drawings to be illustrated in the embodiments of the present disclosure will be briefly described below, it is obvious that the drawings described below are only for some implementations, and for those skilled in the art, other drawings can be obtained according to the illustrated drawings without creative efforts.

Figure 1:
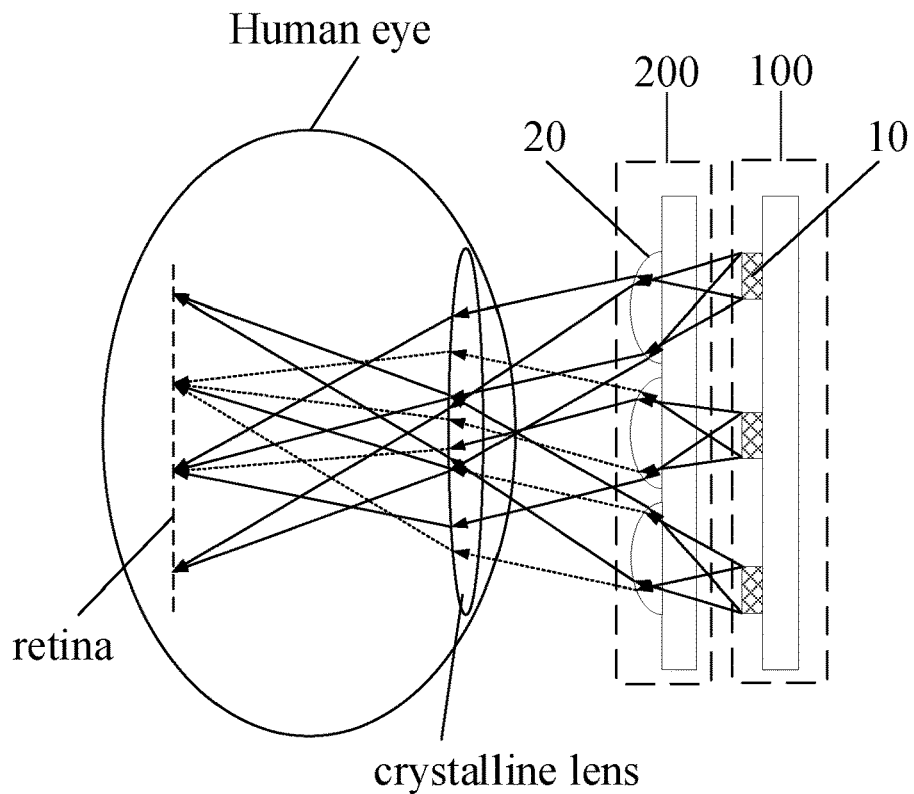
FIG. 1 is a schematic structural diagram of a near-eye display apparatus according to an embodiment of the present disclosure.

Reference signs: display screen 100, micro-lens array 200, imaging lens group 300, pixel island 10, pixel island 20, pixel island group Z, red pixel island 20r, blue pixel island 20b, green pixel island 20g, first green pixel island 20g1, second green pixel island 20g2, red pixel unit r, green pixel unit g, blue pixel unit b, white dot w, w1 and w2.

DETAILED DESCRIPTION

In order to make the aforementioned objects, features and advantages of the present disclosure more comprehensible, the present disclosure will be further described in conjunction with the accompanying drawings and examples. Example embodiments may, however, be embodied in many different forms and should not be construed as limited to the embodiments set forth herein; rather, these embodiments are provided so that the present disclosure will be thorough and complete, and will fully convey the concept of the example embodiments to those skilled in the art. The same reference numerals in the drawings denote the same or similar structures, and thus, a repetitive description thereof will be omitted. The words used in the present disclosure to convey positions and orientations are illustrated in the accompanying drawings, but they may be changed as desired, which are included within the scope of the present disclosure. The drawings of the present disclosure are for illustrative purposes only and do not represent true scale.

The near-eye display is usually a screenshot display, and may be generally designed in the form of a helmet or glasses. The near-eye display technology adopts a micro display screen and an optical system to enlarge an image and then images the image on human eyes. The near-eye display system consists of a left-eye optical path and a right-eye optical path, the structures of such two optical paths are the same, images observed by the left eye and the right eye have a certain parallax therebetween, and finally the images are fused into a stereo image in the brain. Currently, common near-eye display apparatuses are in types of virtual reality and augmented reality.

Virtual reality (VR) technology presents a totally-enclosed virtual environment, and immersive viewing experience in a three-dimensional environment is created by means of a display module. The display principle of the virtual reality is that left-eye and right-eye screens respectively display images for left and right eyes, and after the human eyes acquire the information with the difference, stereoscopic impression is generated in the brain.

Augmented reality (AR) technology is an augmented projection method for superimposing a virtual scene in a real environment. The AR display can fuse the external environment with the virtual world on the basis of the VR display, and presents a vivid interactive experience.

FIG. 1 is a schematic structural diagram of a near-eye display apparatus according to an embodiment of the present disclosure.

As shown in FIG. 1, the near-eye display apparatus includes a display screen 100 and a micro-lens array 200.

The display screen 100 includes a plurality of pixel islands 10, the pixel islands 10 are configured to display portions of an image respectively, and all the pixels islands 10 display the portions of the image so that the image is displayed completely. At least two pixel units are included in each pixel island 10.

The micro-lens array 200 is disposed on a light-emitting side of the display screen 100, and is configured for imaging an image displayed by the display screen 100. The micro-lens array 200 includes a plurality of micro-lenses 20, and each micro-lens 20 corresponds to one pixel island 10.

According to an imaging optical path of a virtual image, the pixel island 10 is arranged within a focal length of the micro-lens 20 corresponding to the pixel island 10, outgoing light rays, after passing through the micro-lens 20, of the pixel units in each pixel island 10 can be approximately regarded as parallel light rays incident to the human eyes, which is then imaged on retinas of the human eyes through crystalline lenses in the human eyes, so that the human eyes can view the display image of the display screen 100.

In practical applications, the left eye and the right eye each correspond to an optical system formed by the display screen 100 and the micro-lens array 200, and due to the fact that there is a certain parallax between display images of the left eye and the right eye, a three-dimensional image can be observed through a fusion by the brain.

Only in a case where fields of view of the light, emitted from the pixel islands 10 adjacent to each other, after being imaged by the micro-lenses 20 corresponding to the pixel islands 10 are continuous, the human eyes can view continuous display images. In order to achieve the effect of the fields of view being continuous, it is desired to design that imaging light rays formed by the outgoing light rays, of the pixel units at edge positions adjacent to each other in the pixel islands 10 adjacent to each other, passing through the micro-lenses 20 are parallel to each other.

Figure 2:
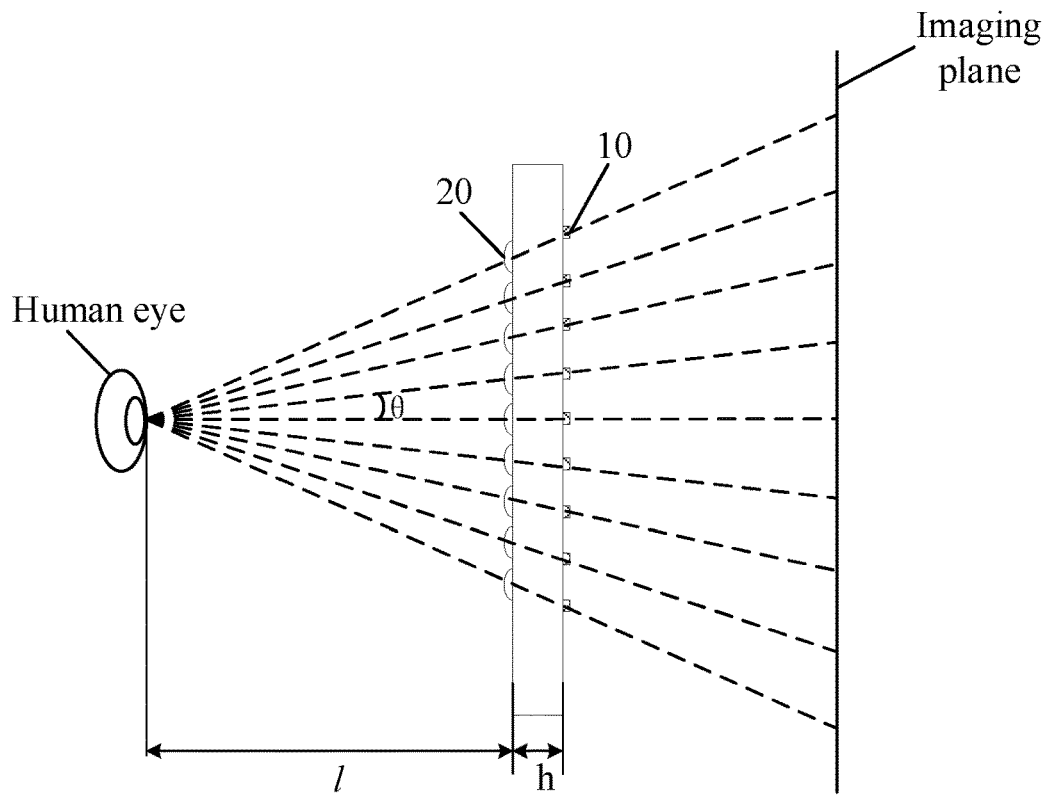
FIG. 2 is a schematic diagram illustrating a principle of splicing of fields of view according to an embodiment of the present disclosure.

FIG. 2 is a schematic diagram illustrating a principle of splicing of fields of view in an embodiment of the present disclosure, a dotted line in FIG. 2 is a chief light ray emitted from the pixel island 10 and passing through a center of the micro-lens 20 corresponding to the pixel island 10, and the chief light ray does not change a propagation direction after passing through the center of the micro-lens 20.

As shown in FIG. 2, if an imaging field of view angle formed by the outgoing light rays, of each pixel island 10, passing through the micro-lens 20 corresponding to the pixel island 10 is equal or the same, the imaging field of view angle corresponding to each pixel island 10 is equal to an included angle between two adjacent chief light rays in FIG. 2, which is θ. If the pixel islands 10 each are in a square shape, and each pixel island 10 has a size of m×m, and n×n pixel units are arranged in each pixel island 10, an angular resolution of the near-eye display apparatus satisfies the following formulas.

$$\tan\frac{\theta}{2} = \frac{m}{2n(l+h)}$$

$$\theta = 2\arctan\left(\frac{m}{2n(l+h)}\right)$$

In the formulas, l is a distance between the human eyes and the micro-lens array, and h is a distance between the micro-lens array and the pixel island.

As can be seen from the above formulas, as the distance h between the micro-lens array and the pixel island increases, a value of the angular resolution θ decreases, the angular resolution capability of the near-eye display apparatus becomes stronger. However, in practical applications, the value h represents a placement height of the micro-lens array, and if the placement height is too large, the overall size of the apparatus is relatively large, and the apparatus is not light enough.

In addition, if the resolution of the near-eye display apparatus is reflected by the final imaging field of view angle of each pixel unit, the angular resolution of the near-eye display apparatus is θ/n. As can be seen from this formula, the angular resolution is greater as each pixel island 10 containing a greater number of pixel units. However, due to the limitation of display processes, currently, the display screen can only achieve a resolution of about 500 PPI, and cannot meet the use expectations.

In view of above, an embodiment of the present disclosure provides a near-eye display apparatus, which can effectively improve the resolution. The near-eye display apparatus provided by the embodiment of the present disclosure may be applied to AR or VR display, which is not limited herein.

Figure 3:
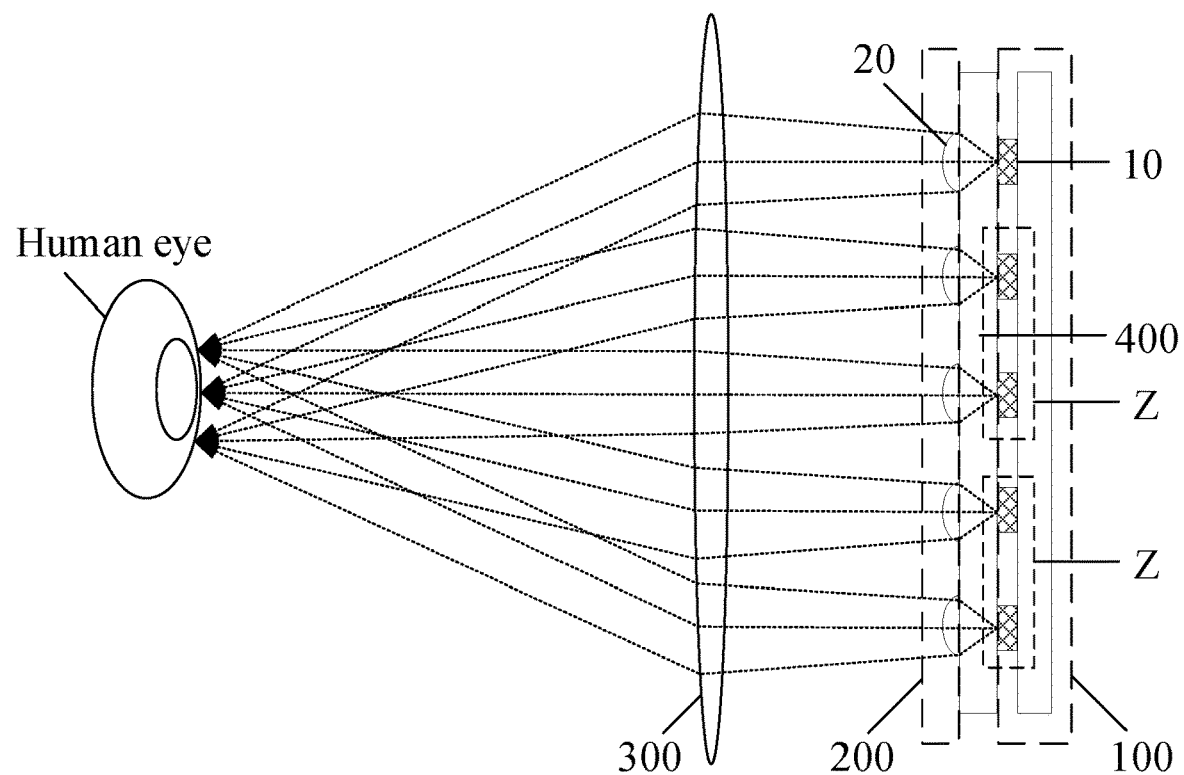
FIG. 3 is a schematic structural diagram of a near-eye display apparatus according to an embodiment of the present disclosure.

FIG. 3 is a schematic structural diagram of a near-eye display apparatus according to an embodiment of the present disclosure.

As shown in FIG. 3, the near-eye display apparatus includes a display screen 100, a micro-lens array 200, and an imaging lens group 300.

The display screen 100 is configured for displaying an image, and includes a plurality of pixel island groups Z each including at least one pixel island 10, each pixel island 10 includes a plurality of pixel units. The pixel island groups Z are configured for displaying partial images, and the partial images displayed by the pixel island groups Z form a complete image.

The micro-lens array 200 is disposed at a light-emitting side of the display screen 100, and includes a plurality of micro-lenses 20, each micro-lens 20 corresponds to one pixel island 10, and the micro-lenses 20 are configured to image an image displayed by the pixel islands 10 corresponding thereto.

The imaging lens group 300 is disposed on a side of the micro-lens array 200 away from the display screen 100, and is configured for collimating imaging light of the micro-lenses. Therefore, the collimated light can be incident into the human eyes, and is imaged by the crystalline lens of the human eyes and then received and imaged on the retinas of the human eyes, so that the human eyes can view the display image of the display screen 100 through the near-eye display apparatus.

In order to make continuous display images be viewed by the human eyes, imaging field of view angles formed by outgoing light rays, of the pixel island groups Z adjacent to each other, passing through the micro-lenses 20 corresponding to the pixel island groups Z and the imaging lens group 300 are continuous with each other.

Figure 4:
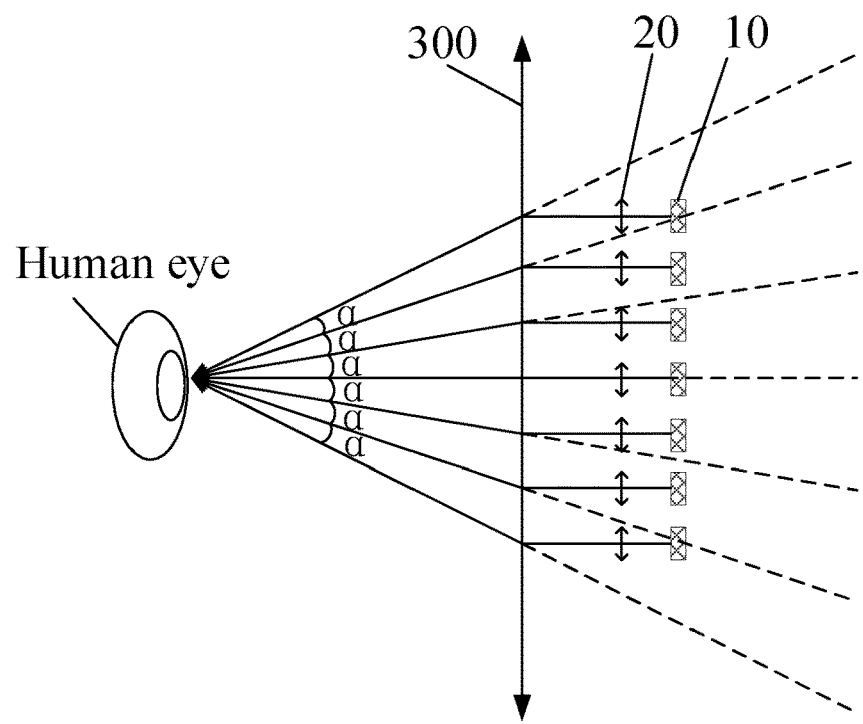
FIG. 4 is a schematic diagram illustrating a principle of splicing of fields of view according to an embodiment of the present disclosure.

FIG. 4 is a schematic diagram illustrating a principle of splicing of fields of view in an embodiment of the present disclosure.

As shown in FIG. 4, by making the distance between the pixel island 10 and the micro-lens 20 corresponding to the pixel island 10 less than the focal length of the micro-lens, and making an image, displayed by the pixel island 10, imaged by the micro-lens 20 corresponding to the pixel island 10 be at the focal point of imaging lens group 300, the micro-lens 20 can image the image displayed by the pixel island 10 corresponding to the micro-lens 20 as a virtual image which is erect and enlarged, and the virtual image is at the focal point of the imaging lens group 300, which can make the finally outgoing light rays of the imaging lens group 300 be collimated light rays, then the human eyes receive the collimated light rays, an imaging point is generated at a position of infinity, the display image of the display screen 100 can be observed by the human eyes at an appropriate position.

By adjusting parameters such as the distance between the micro-lens array 200 and the imaging lens group 300, the distance between the micro-lens 20 and the pixel island 10, and the focal length of the imaging lens group 300, the collimated light rays formed by the outgoing light rays, of the pixel units adjacent to each other of the pixel island groups Z adjacent to each other, passing through the micro-lenses 20 corresponding thereto and imaging lens group 300 are parallel to each other, so that angles at which the collimated light rays enter the human eyes are the same, and thus, the imaging field of view angles of the pixel island groups adjacent to each other are continuous.

By providing the micro-lens array and the imaging lens group simultaneously in the near-eye display apparatus, through changing parameters such as the focal length of imaging lens group, the focus length of the micro-lens, the distance between the imaging lens group and the micro-lens array, the angular resolution can be improved without increasing the distance between micro-lens array and the display screen, consequently, the near-eye display apparatus can be portable simultaneously.

In order to further increase the resolution of the display screen 100, the display screen 100 in the embodiment of the present disclosure may adopt a silicon-based organic-light-emitting-diode display screen, and since the silicon-based display process can implement a direct fabrication of a display device on an integrated chip, compared with the conventional display process, the display PPI of the display screen may be increased to 2000 to 3000, and the number of pixel units under the field of view angle corresponding to each single micro-lens 20 is increased.

Therefore, the near-eye display apparatus can be greatly improved in both imaging resolution and display resolution.

As shown in FIG. 3, in order to adjust the distance between the micro-lens array 200 and the display screen 100, a transparent substrate 400 may be disposed between the display screen 100 and the micro-lens array 200. The micro-lens array 200 is disposed on a surface of the transparent substrate 400 away from the display screen 100.

A thickness of the transparent substrate 400 depends on an adjustment of parameters between the micro-lens array 200 and the display screen 100. If the distance between the micro-lens 20 and the pixel island 10 is desired to be increased, the thickness of the transparent substrate 400 is to be increased appropriately.

The transparent substrate 400 plays a role of supporting the micro-lens array 200 without a deflection effect on light. Therefore, the transparent substrate 400 may be made of a material having a relatively high transmittance, for example, a material such as silicon nitride ($Si_3N_4$) generally for a glass substrate of a display panel. For a light weight, the transparent substrate 400 may be made of a transparent material such as polymethyl methacrylate (PMMA), which is not limited.

Figure 5:
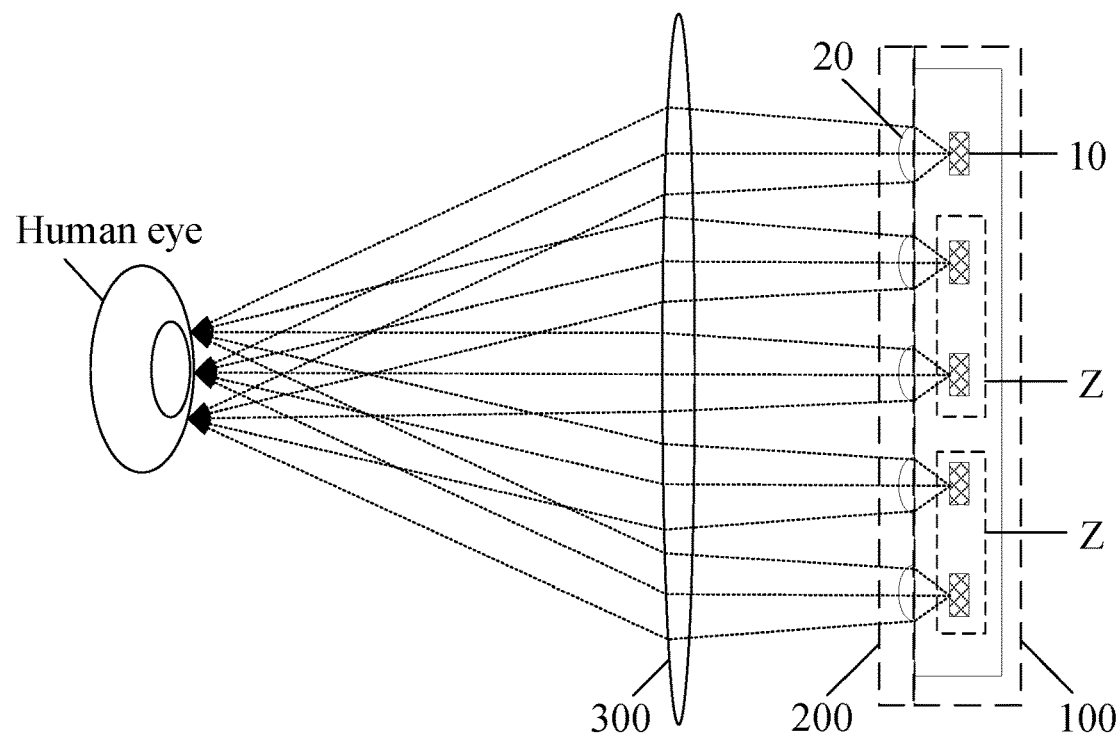
FIG. 5 is a schematic structural diagram of a near-eye display apparatus according to an embodiment of the present disclosure.

FIG. 5 is a schematic structural diagram of a near-eye display apparatus according to an embodiment of the present disclosure.

As shown in FIG. 5, in order to improve the integration of the near-eye display apparatus, the micro-lens array 200 may be directly disposed on the surface of the display screen 100 on the light-emitting side without providing a transparent substrate, thereby reducing the placement height of the micro-lens array, and the micro-lens array and the display panel may be integrated to realize integrated display.

Since the micro-lenses 20 are configured to image images displayed by the pixel islands 10 corresponding thereto, the object distance of the micro-lens 20 is the distance between the micro-lens 20 and the pixel island 10 corresponding thereto, and each pixel island 10 is a set of pixels formed by a plurality of pixel units in the display screen 100, so that even if the micro-lens array 200 is directly formed on the surface of the display screen 100, a certain distance between the micro-lenses 20 and the pixel islands 10 can be maintained.

In the embodiment of the present disclosure, each micro-lens 20 in the micro-lens array 200 may adopt one of a geometric lens, a super-lens, or an optical diffraction lens.

The geometric lens follows the refraction principle of light, and the imaging quality can be improved by designing the surface shape of the micro-lens. The processing difficulty and the cost of the geometric lens are relatively low.

The super-lens is formed by a surface of a meta-material and generally has a relatively small thickness, so that the integration between the display screen and the micro-lens array can be further improved by imaging the display image of the display screen using the super-lens.

The optical diffraction lens generally has a diffraction structure, and has excellent performance in the aspects of compensating imaging quality and eliminating aberration and chromatic aberration.

For performing an optical design, any type of the above-mentioned micro-lens may be selected as desired, which is not limited herein.

In an aspect, the imaging lens group 300 includes at least one lens, and the surface type of the lens in the imaging lens group is one of a spherical surface, an aspherical surface, a free-form surface, or a super surface.

The imaging lens group 300 may adopt a single lens to simplify the structure; alternatively, two, three, or more lenses may be used in the imaging lens group 300 to optimize the imaging quality, and the number of lenses in the imaging lens group 300 is not particularly limited in the embodiment of the present disclosure.

The surface type of the lens in the imaging lens group 300 may be a spherical surface, an aspherical surface, a free-form surface, or a super surface. The spherical lens has the advantages of simple design, low expectation on assembly precision and the like. A thickness of an aspherical lens or a free-form surface lens is relatively small, so that the image quality can be optimized. A super-lens made of a mate-material has a relatively small thickness and has the advantage that a geometric lens cannot achieve. Any lens mentioned above may be selected as desired for an optical design.

Each lens in the imaging lens group 300 may be made of an optical plastic, such as PMMA, or may be made of an optical glass, such as BK7, ZF6, which is not limited herein.

For convenience of design, in the embodiment of the present disclosure, the pixel islands 10 are the same in shape and size, and the micro-lenses 20 are the same in shape and size.

To realize a full-color display, the display screen 100 includes at least two colors of pixel units. In the embodiment of the present disclosure, the colors of the pixel units in each pixel island 10 are the same, and the colors of the pixel units in different pixel islands 10 in each pixel island group Z are different.

Figure 6:
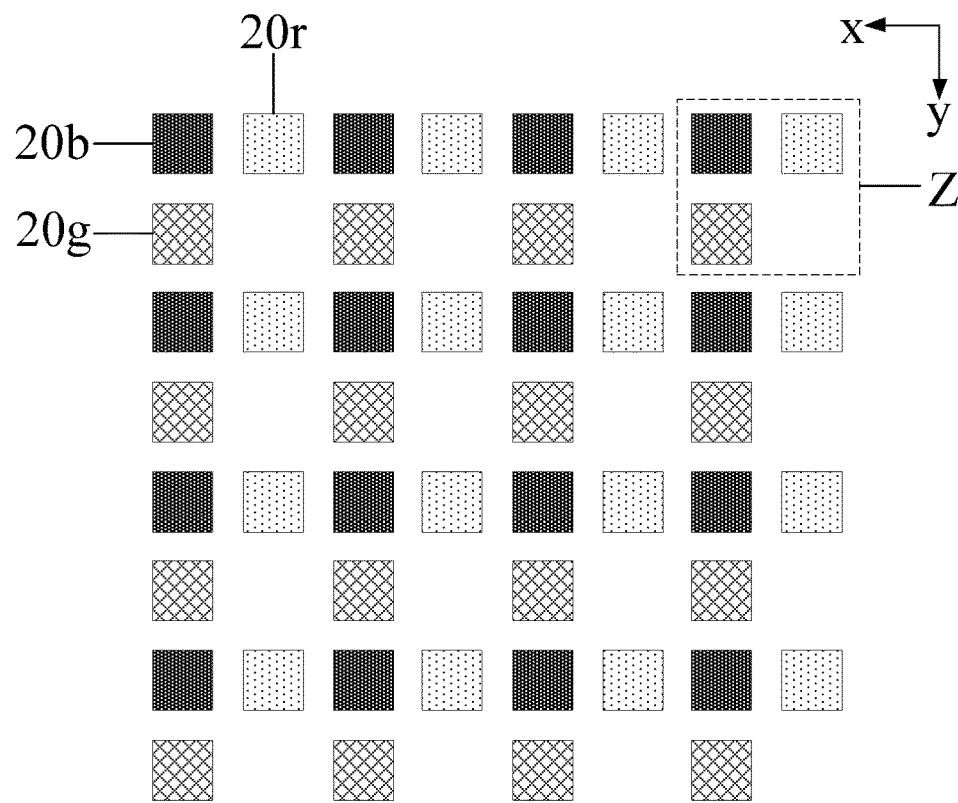
FIG. 6 is a plan view illustrating a structure of a display screen according to an embodiment of the present disclosure.
Figure 7:
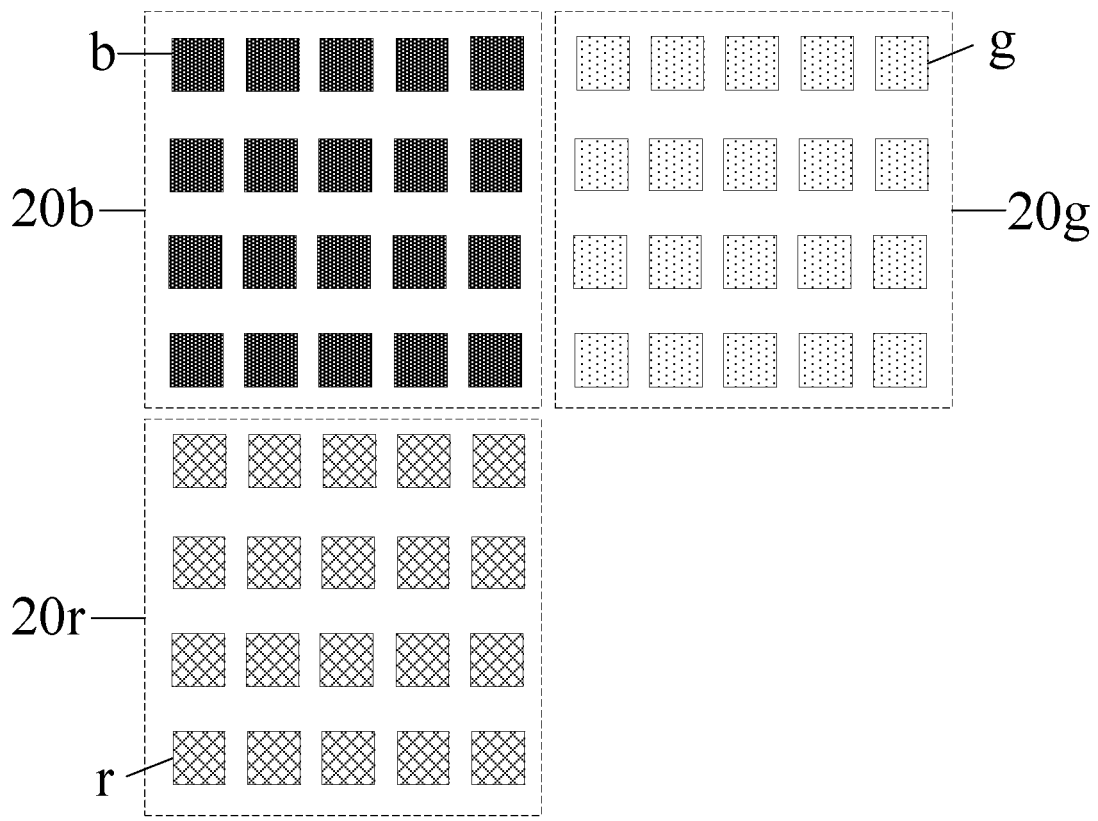
FIG. 7 is a plan view illustrating a structure of a pixel island group according to an embodiment of the present disclosure.

FIG. 6 is a plane view illustrating a structure of a display screen according to an embodiment of the present disclosure, and FIG. 7 is a plane view illustrating a structure of a pixel island group according to an embodiment of the present disclosure.

For example, as shown in FIGS. 6 and 7, the display screen 100 may include a red pixel unit r, a green pixel unit g and a blue pixel unit b, and then the pixel island formed by a plurality of red pixel units r is a red pixel island 20$r$, the pixel island formed by a plurality of green pixel units g is a green pixel island 20$g$, and the pixel island formed by a plurality of blue pixel units b is a blue pixel island 20$b$. Each pixel island group Z may include one red pixel island 20$r$, one green pixel island 20$g$, and one blue pixel island 20$b$. The arrangement rules of the pixel units included in the red pixel island 20$r$, the green pixel island 20$g$ and the blue pixel island 20$b$ are the same, so that the red pixel island, the green pixel island and the blue pixel island are the same in shape and size.

In the embodiment of the present disclosure, the imaging field of view angles formed by the outgoing light rays, of the pixel islands 10 including the pixel units of the same color, passing through the micro-lenses 20 corresponding to the pixel islands 10 and the imaging lens group 300 are continuous with each other. The imaging field of view angles formed by the outgoing light rays, of the pixel islands 10 adjacent to each other in each pixel island group Z, passing through the micro-lenses 20 corresponding to the pixel islands 10 and the imaging lens group 300 have an intersection therebetween.

Specifically, each pixel island group Z is configured to display a partial image, and in order to realize full-color display, in each pixel island group Z, the red pixel island 20$r$ displays a red component in the partial image, the green pixel island 20$g$ displays a green component in the partial image, and the blue pixel island 20$b$ displays a blue component in the partial image. Moreover, images displayed by the red pixel island 20$r$, the green pixel island 20$g$ and the blue pixel island 20$b$ in each pixel island group Z are imaged at the same position of the human eyes, so that the human eyes can fuse the images into a full-color image in the brain. Therefore, the image displayed by the pixel islands of various colors in each pixel island group Z has substantially the same field of view angle, and the imaging field of view angles corresponding to the pixel island groups adjacent to each other are continuous with each other. By adjusting the distance between the micro-lens array 200 and the imaging lens group 300, the distance between the micro-lenses 20 and the pixel islands 10 corresponding to the micro-lenses 20, that is, the placement height of the micro-lenses, the focal lengths of the micro-lenses 20 and the imaging lens group 300, and other parameters, the imaging light rays formed by the outgoing light rays, of the pixel units adjacent to each other of the pixel island groups adjacent to each other, passing through the micro-lenses 20 corresponding thereto and the imaging lens group 300 can be parallel to each other, thereby realizing a continuous of the imaging field of view angles.

For example, the pixel island group at a center is the $0^{th}$ pixel island group, and the pixel island groups arranged in a certain direction with the $0^{th}$ pixel island group as the center to both sides are the $1^{st}$ pixel island group and the $(-1)^{st}$ pixel island group, respectively. If the imaging field of view angle of the 0th pixel island group ranges from −2 degrees to 2 degrees, the imaging field of view angle of the $1^{st}$ pixel island group may range from 2 degrees to 4 degrees, and the imaging field of view angle of the $(-1)^{st}$ pixel island group may range from −4 degrees to −2 degrees.

In principle, it is desired that imaging positions of the pixel islands in each pixel island group Z are the same, and the imaging field of view angles are the same, so that different color components can be fused at the same position to form an image display at the position. However, due to the arrangement of the imaging lens group 300, a certain offset may occur in a light ray incident to a certain position of the imaging lens group 300 during imaging.

Figure 8:
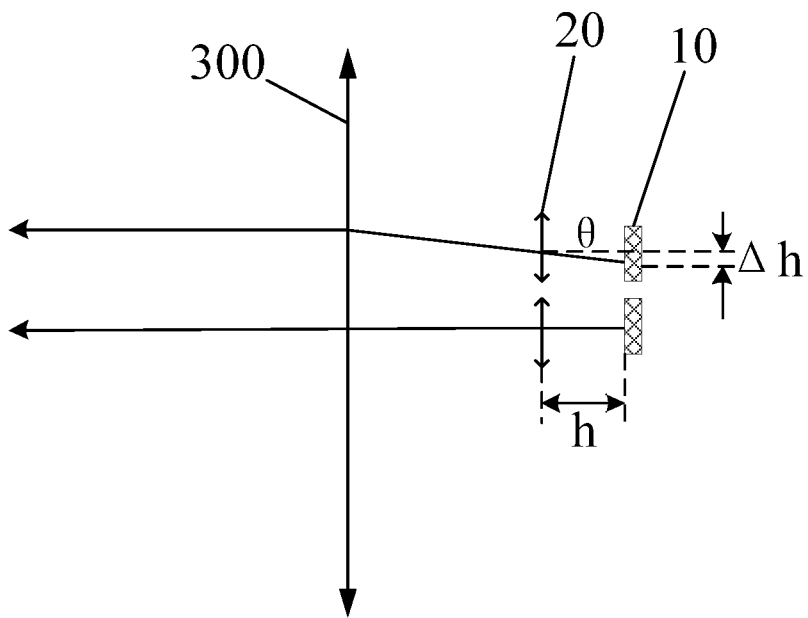
FIG. 8 is a schematic diagram illustrating a principle of shifting of a field of view according to an embodiment of the present disclosure.

FIG. 8 is a schematic diagram illustrating a principle of shifting of a field of view in an embodiment of the present disclosure.

If the outgoing light rays of the pixel units at certain positions in two pixel islands 10 adjacent to each other are parallel to each other after passing through the micro-lenses 20 corresponding to the pixel islands 10 and the imaging lens group 300, the pixel units at the certain positions in the two pixel islands 10 are at the same position in the pixel islands, and display the same display content. If one of the two light rays is the chief light ray passing through the micro-lens 20 corresponding thereto, then the other light ray is also the chief light ray passing through the micro-lens corresponding thereto, however, in practical applications, as shown in FIG. 8, due to the imaging lens group 300, the light ray at the upper side is traced and found not to be the chief light ray of the micro-lens corresponding thereto, and has a certain offset distance $\Delta h$ from the chief light ray, $\Delta h = h \times \tan \theta$. If the problem of the offset is to be corrected, the relative position between the pixel island and the micro-lens corresponding to the pixel island is desired to be changed, however, if the offset distance is greater than the difference between a period of lenses and a size of the pixel island, a situation that two pixel islands are desired to be arranged at the same position occurs, and obviously, such structural arrangement cannot be achieved.

Therefore, in order to avoid the problem that the imaging field of view angle has a certain offset, the embodiment of the present disclosure does not adjust the position of the pixel island in the near-eye display apparatus, but adjusts the display content of the pixel island, so that the same image content is displayed at the same imaging position.

For design convenience, in the embodiment of the present disclosure, the number of the pixel islands included in each pixel island group Z is the same, the imaging field of view angle formed by the outgoing light rays, of each pixel island group Z, passing through the micro-lenses 20 corresponding thereto and the imaging lens group 300 is the same, and the imaging field of view angles of the respective pixel islands in each pixel island group Z are also the same, so that, in the embodiment of the present disclosure, the imaging field of view angles corresponding to the pixel islands are equal, for example, the imaging field of view angle corresponding to each pixel island may be about 4°.

Figure 9:
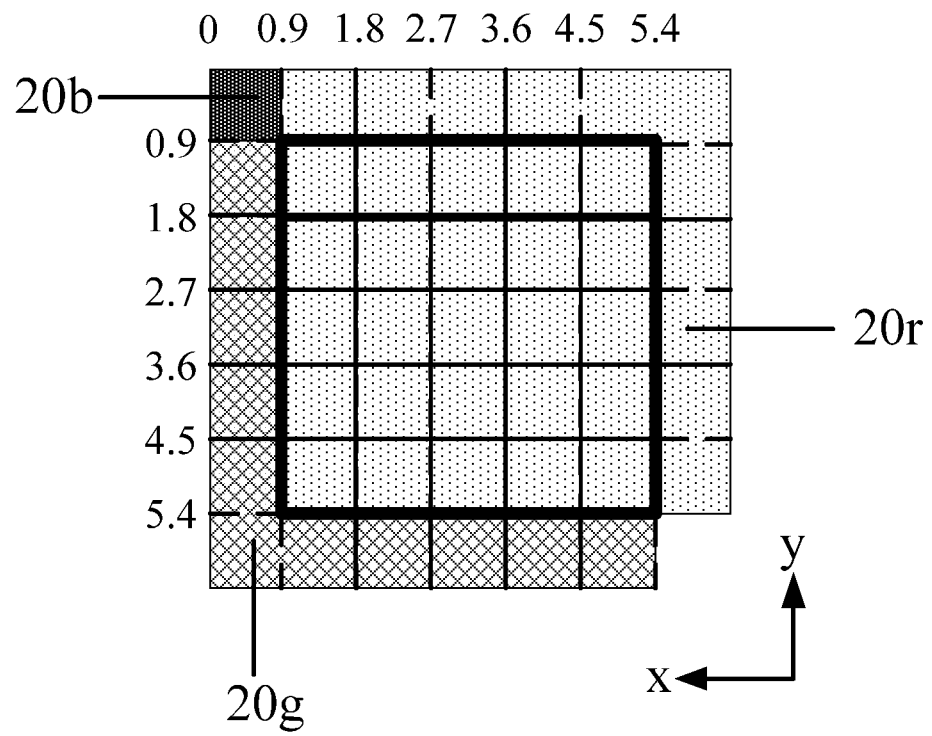
FIG. 9 is a schematic diagram illustrating a principle of shifting of a field of view angle according to an embodiment of the present disclosure.

The field of view angle is desired to be shifted for the display contents of the pixel islands 10 in each pixel island group Z. FIG. 9 is a schematic diagram illustrating a principle of shifting of a field of view angle in an embodiment of the present disclosure, FIG. 10a is a graph of a relationship between a field of view angle in an x direction and luminance according to an embodiment of the present disclosure, and FIG. 10b is a graph of a relationship between a field of view angle in a y direction and luminance according to an embodiment of the present disclosure.

In a case where the pixel islands of the respective colors in the pixel island group Z are arranged as shown in FIG. 6, the red pixel island 20r is located on a right side of the blue pixel island 20b in the x direction, and the green pixel island 20g is located on a lower side of the blue pixel island 20b in the y direction. Then, according to theoretical analysis, if the imaging field of view angle corresponding to each pixel island 20 is about 1.8°, as shown in FIG. 9, the imaging field of view angle of the red pixel island 20r is shifted by 0.9° to the right in the x direction with respect to the imaging field of view angle of the blue pixel island 20b, and the imaging field of view angle of the green pixel island 20g is shifted downward by 0.9° in the y direction with respect to the imaging field of view angle of the blue pixel island 20b.

Figure 10A:
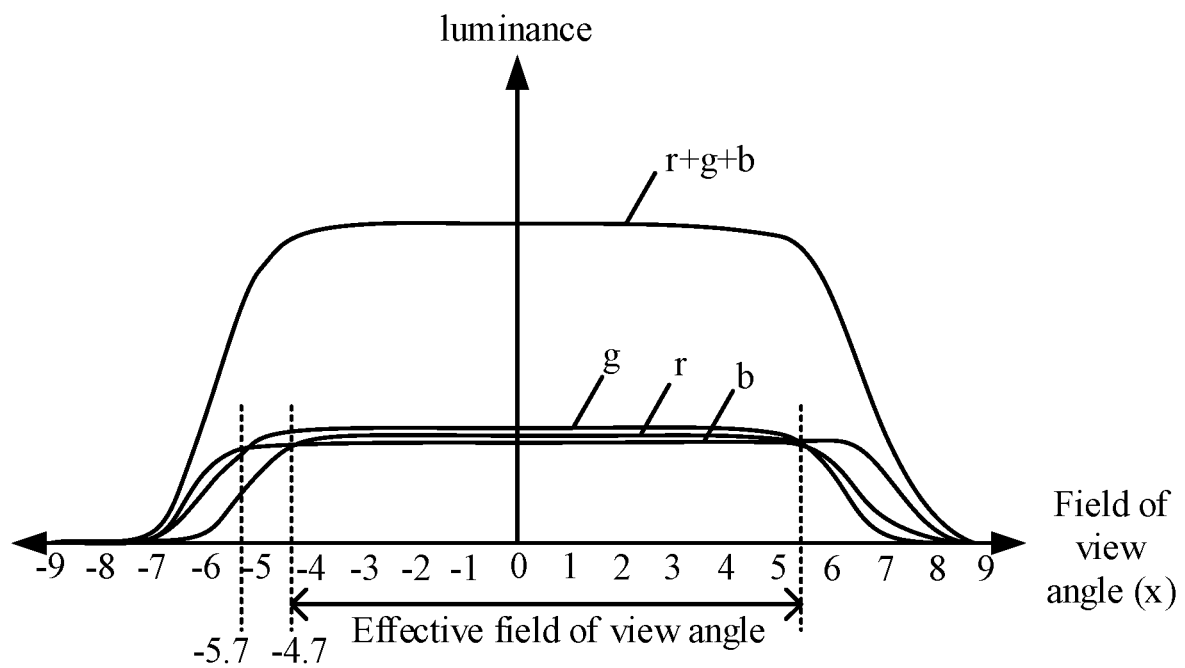
FIG. 10a is a graph of a relationship between a field of view angle in an x direction and luminance according to an embodiment of the present disclosure.
Figure 10B:
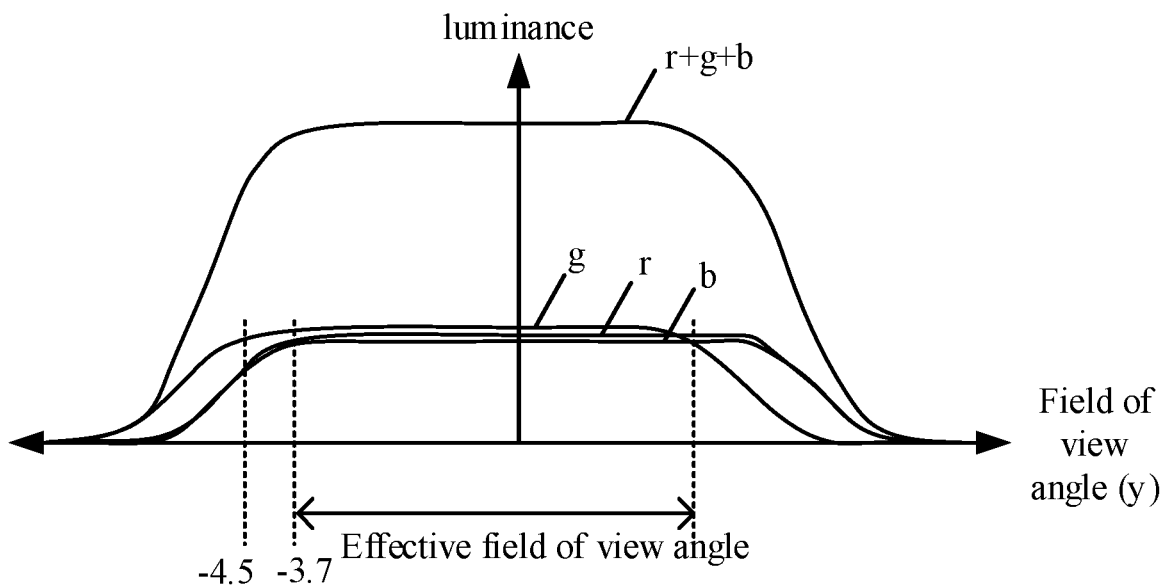
FIG. 10b is a graph of a relationship between a field of view angle in a y direction and a luminance according to an embodiment of the present disclosure.

As shown in FIGS. 10a and 10b, r represents a luminance curve corresponding to a red pixel island, g represents a luminance curve corresponding to a green pixel island, b represents a luminance curve corresponding to a blue pixel island, and r+g+b represents a total luminance curve of the pixel islands of three colors. According to the simulation results, as shown in FIGS. 10a and 10b, the total luminance of the pixel islands of three colors is the sum of the luminance of the pixel islands of three colors. If the imaging field of view angle corresponding to each pixel island is about 1.8°, as shown in FIG. 10a, in the x direction, a difference between the imaging field of view angles of the red pixel island and the blue pixel island is about 0.8° (approximately 0.9°), and as shown in FIG. 10b, in the y direction, the difference between the imaging field of view angles of the green pixel island and the blue pixel island is about 10 (approximately 0.9°).

Therefore, according to theoretical analysis and simulation results, the following can be determined that, the imaging field of view angles of the pixel islands adjacent to each other in each pixel island group Z are not completely the same, but a certain offset may be generated between the field of view angles, the offset is a half of the imaging field of view angle corresponding to one pixel island, so that there is also an intersection between the imaging field of view angles of the pixel islands adjacent to each other, and the intersection is also a half of the imaging field of view angle of one pixel island.

According to the above analysis, if two pixel islands adjacent to each other in each pixel island group Z are respectively referred to as a first pixel island and a second pixel island, the field of view angle corresponding to the first pixel island displaying a first image is a first field of view angle, and the field of view angle corresponding to the second pixel island displaying a second image is a second field angle, the first field of view angle is equal to the second field of view angle, and the second field of view angle is formed by the first field of view angle being shifted by a half of the first field of view angle along a preset direction, and the preset direction is an arrangement direction along which the first pixel island and the second pixel island are arranged.

For example, in a case where the pixel islands are arranged according to the arrangement rule shown in FIG. 6, if the imaging field of view angle of the blue pixel island 20b in the x direction ranges from −2° to 2°, and the imaging field of view angle of the blue pixel island 20b in the y direction ranges from −2° to 2°, the imaging field of view angle of the red pixel island 20r in the x direction ranges from 0° to −4°, and the imaging field of view angle of the green pixel island 20g in the y direction ranges from −4° to 0°. With the above-described field of view angle for image displaying, the red pixel island 20r, the green pixel island 20g, and the blue pixel island 20b within the effective field of view in the dashed line box in FIG. 9 can be made to display the same content without an image deviation.

Figure 11A:
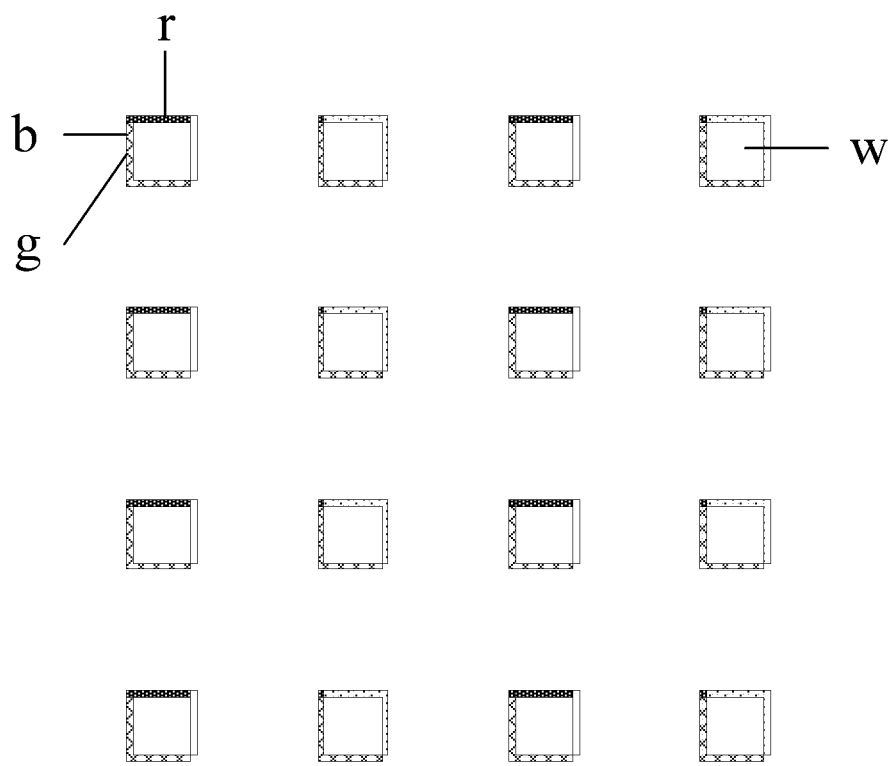
FIG. 11a is a schematic diagram of a light mixing effect according to an embodiment of the present disclosure.
Figure 11B:
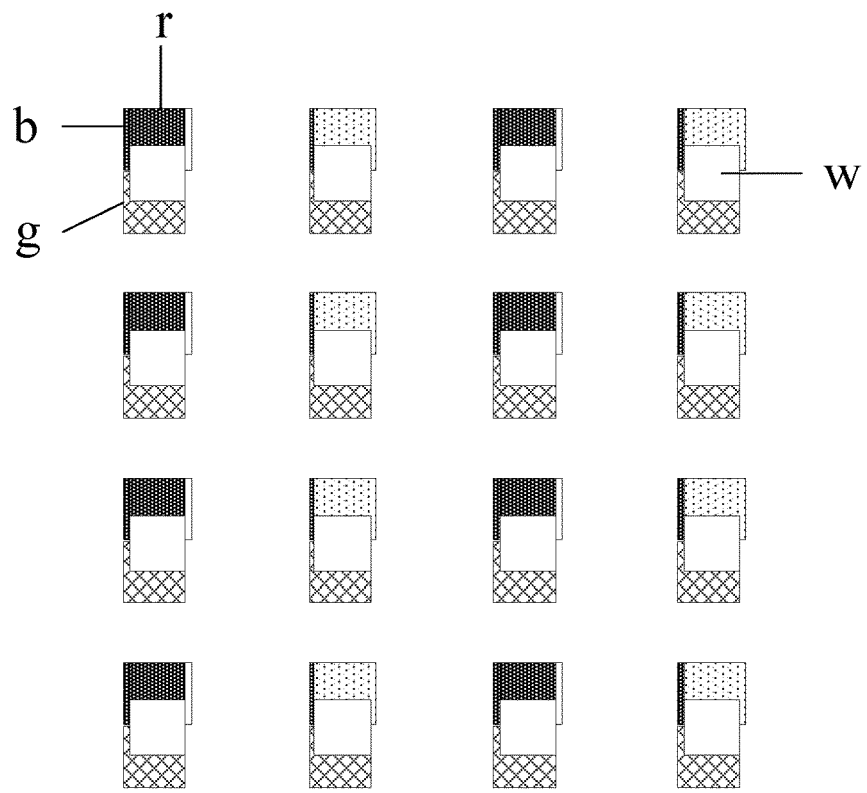
FIG. 11b is a schematic diagram of a light mixing effect according to an embodiment of the present disclosure.
Figure 11C:
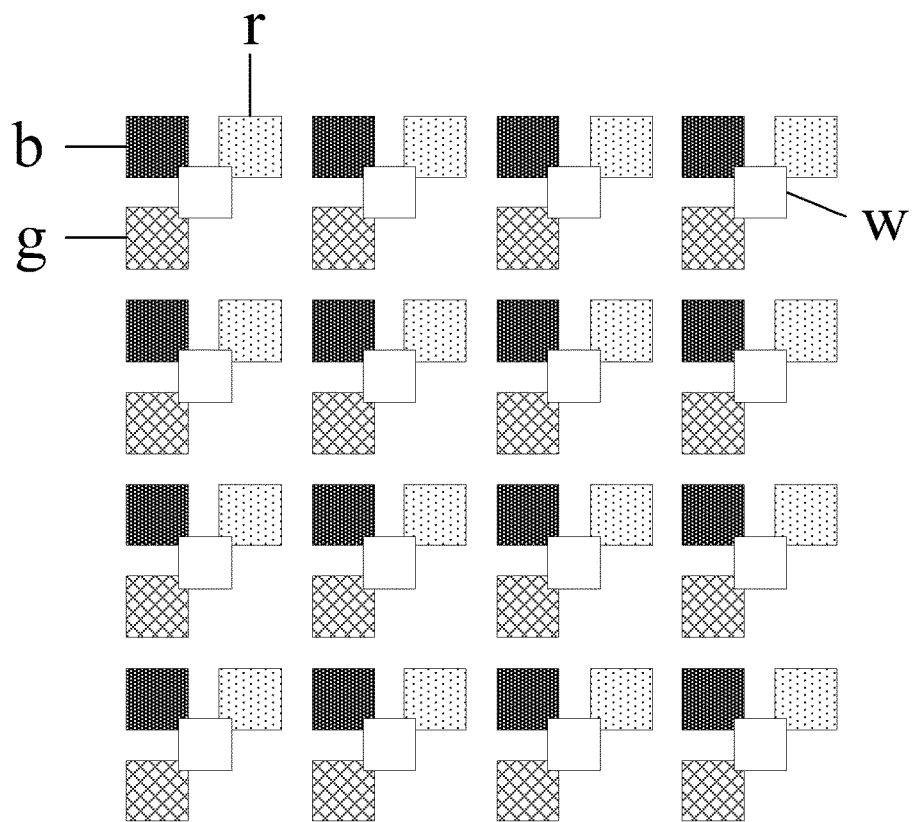
FIG. 11c is a schematic diagram of a light mixing effect according to an embodiment of the present disclosure.

The light mixing of the retinas of the human eyes to the colors may be divided into several kinds, FIG. 11a is a schematic diagram of a light mixing effect according to an embodiment of the present disclosure, FIG. 11b is a schematic diagram of a light mixing effect according to an embodiment of the present disclosure, and FIG. 11c is a schematic diagram of a light mixing effect according to an embodiment of the present disclosure.

As shown in FIG. 11a, the pixel units, of three colors, including a red pixel unit r, a green pixel unit g and a blue pixel unit b are superimposed together to form a white point w. As shown in FIG. 11b, the pixel units, of three colors, including the red pixel unit r, the green pixel unit g and the blue pixel unit b are separate from each other to form a white point w. As shown in FIG. 11c, the pixel units, of two colors, among the red pixel unit r, the green pixel unit g and the blue pixel unit b are superimposed and the pixel unit of the other color is separate, so that a white dot w is formed.

However, in a case where the arrangement rule of the pixel islands shown in FIG. 6 is adopted, the space in the area of each pixel island group is not fully utilized, and thus, in the embodiment of the present disclosure, one more pixel island is further added in the pixel island group.

Figure 12:
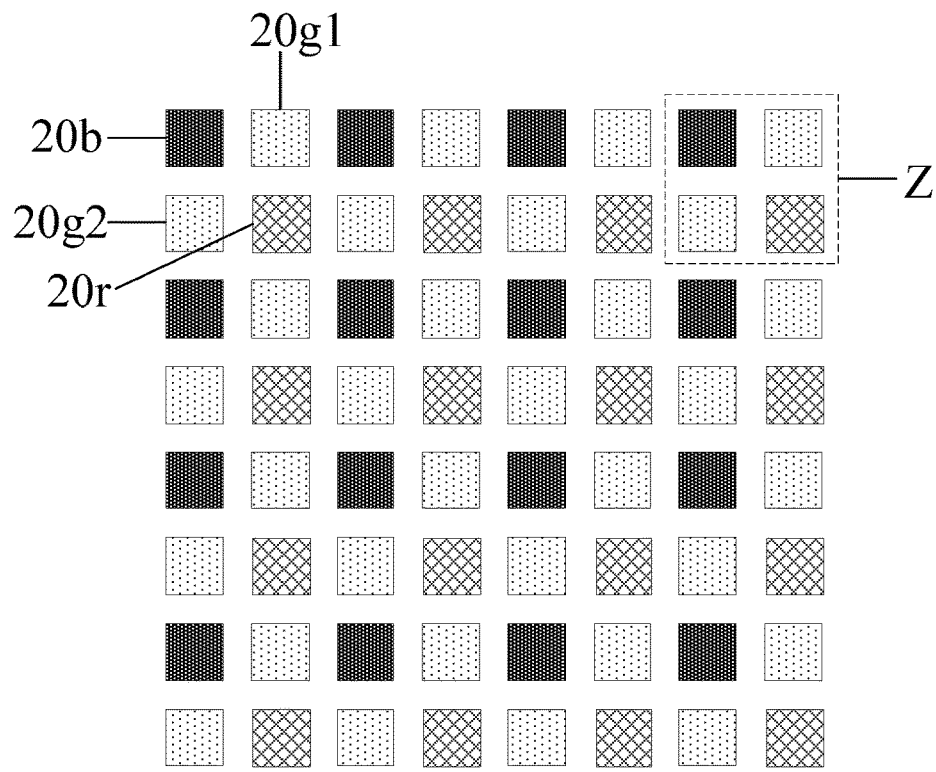
FIG. 12 is a plan view illustrating a structure of a display screen according to an embodiment of the present disclosure.

FIG. 12 is a plan view illustrating a structure of a display screen according to an embodiment of the present disclosure.

As shown in FIG. 12, the pixel island group Z includes: a blue pixel island 20b, a red pixel island 20r, a first green pixel island 20g1 and a second green pixel island 20g2, each pixel unit in the blue pixel island 20b is blue, each pixel unit in the red pixel island 20r is red, and each pixel unit in the first green pixel island 20g1 and the second green pixel island 20g2 is green.

The blue pixel island 20b, the red pixel island 20r, the first green pixel island 20g1, and the second green pixel island 20g2 are arranged in a square array of two rows and two columns, the blue pixel island 20b and the red pixel island 20r are located on one diagonal of the square array, and the first green pixel island 20g1 and the second green pixel island 20g2 are located on the other diagonal of the square array.

A green pixel island is further added in the structure of the original pixel island group, so that the overall luminance of the display screen can be improved. In addition, after one more green pixel island is further added, the red pixel unit and the blue pixel unit can be respectively mixed with the two green pixel units to form two white dots, so that the display resolution is improved.

Figure 13:
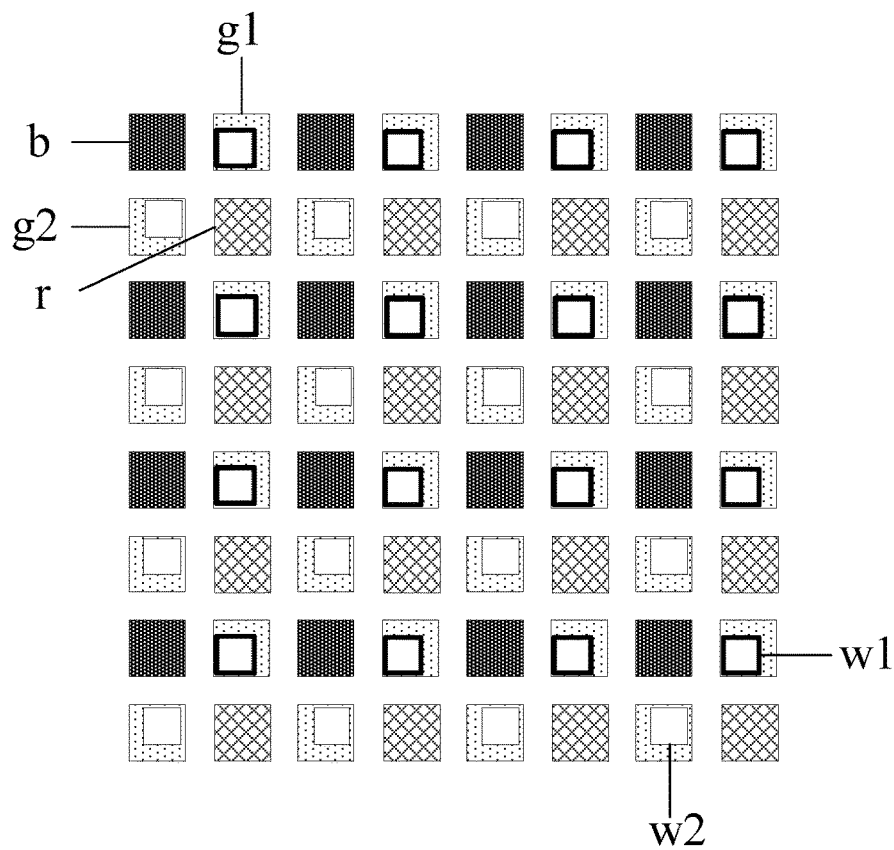
FIG. 13 is a schematic diagram of a light mixing effect achieved by the structure shown in FIG. 12.

However, in the light mixing mode shown in FIGS. 11a and 11c, the white dots formed by the pixel units of different colors in a superimposition manner will cause a waste of resolution. The light mixing effect achieved by using the light mixing manner shown in FIG. 11b is shown in FIG. 13, and taking the pixel units in each single pixel island group as an example, the light mixing after adding one more green pixel island can generate two white dots w1 and w2, however, the two white dots w1 and w2 cannot define the resolution by the product of the number of rows and columns in the conventional sense. Taking FIG. 13 as an example, the resolution of the pixel islands in FIG. 13 during displaying is 4×4×2, which cannot be defined by the conventional resolution m×n.

In view of this, the embodiment of the present disclosure can avoid the above problem by rotating each pixel unit in the pixel island by a preset angle and then performing light mixing.

Figure 14:
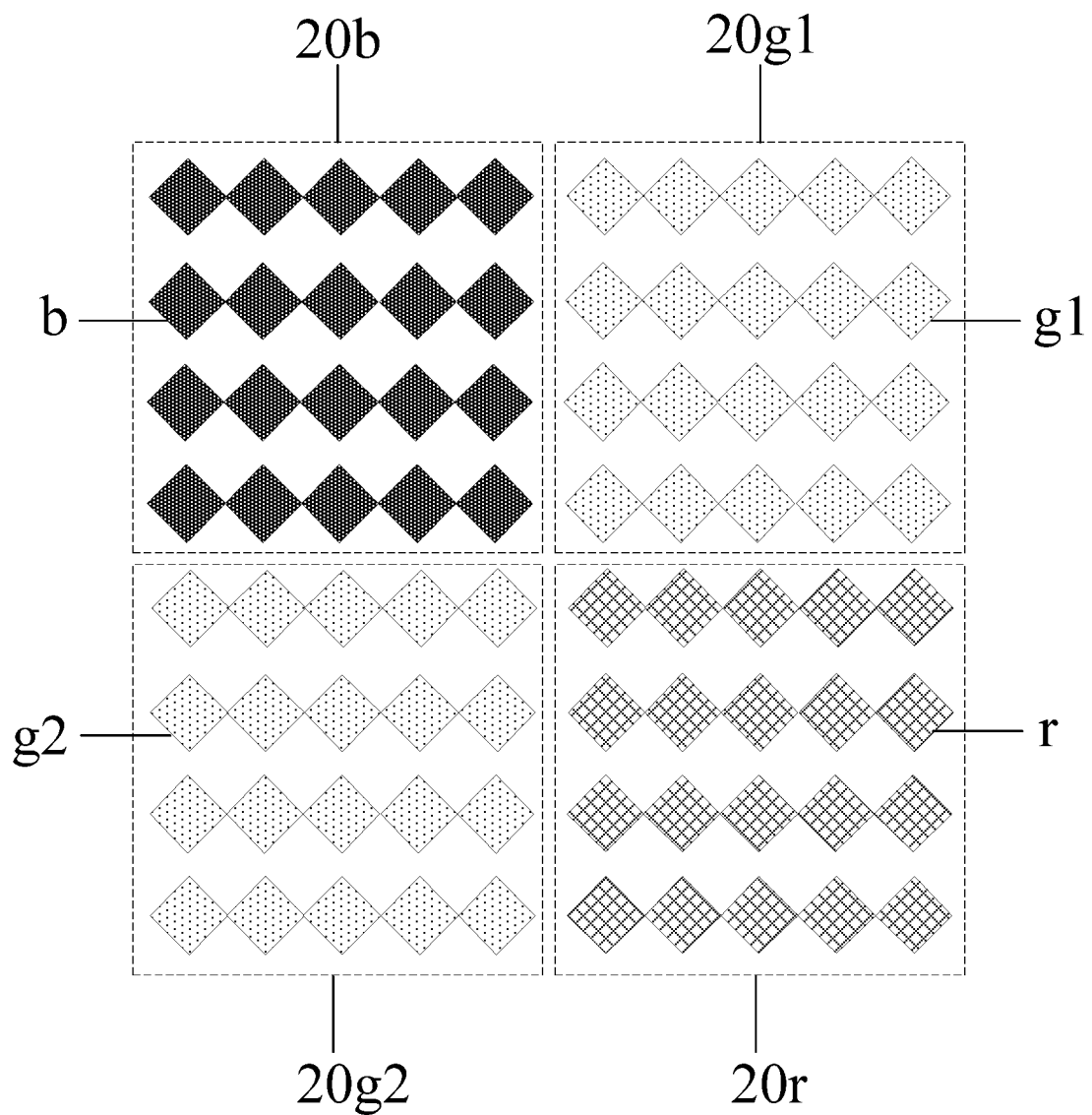
FIG. 14 is a plan view illustrating a structure of a pixel island group according to an embodiment of the present disclosure.

FIG. 14 is a plan view illustrating a structure of a pixel island group according to an embodiment of the present disclosure.

As shown in FIG. 14, the pixel units in the pixel island are arranged in an array, each pixel unit is rectangular, and a preset angle is formed between an edge of the pixel unit and the arrangement direction in which the pixel units in each row are arranged, and in practical applications, the preset angle may be about 45°.

Specifically, each pixel island group Z includes a blue pixel island 20b, a red pixel island 20r, a first green pixel island 20g1, and a second green pixel island 20g2. Each pixel unit within each pixel island is rotated by 45°. In this case, the display resolution can be defined in a conventional manner if the light mixing is performed in a superimposition or staggered manner.

Figure 15A:
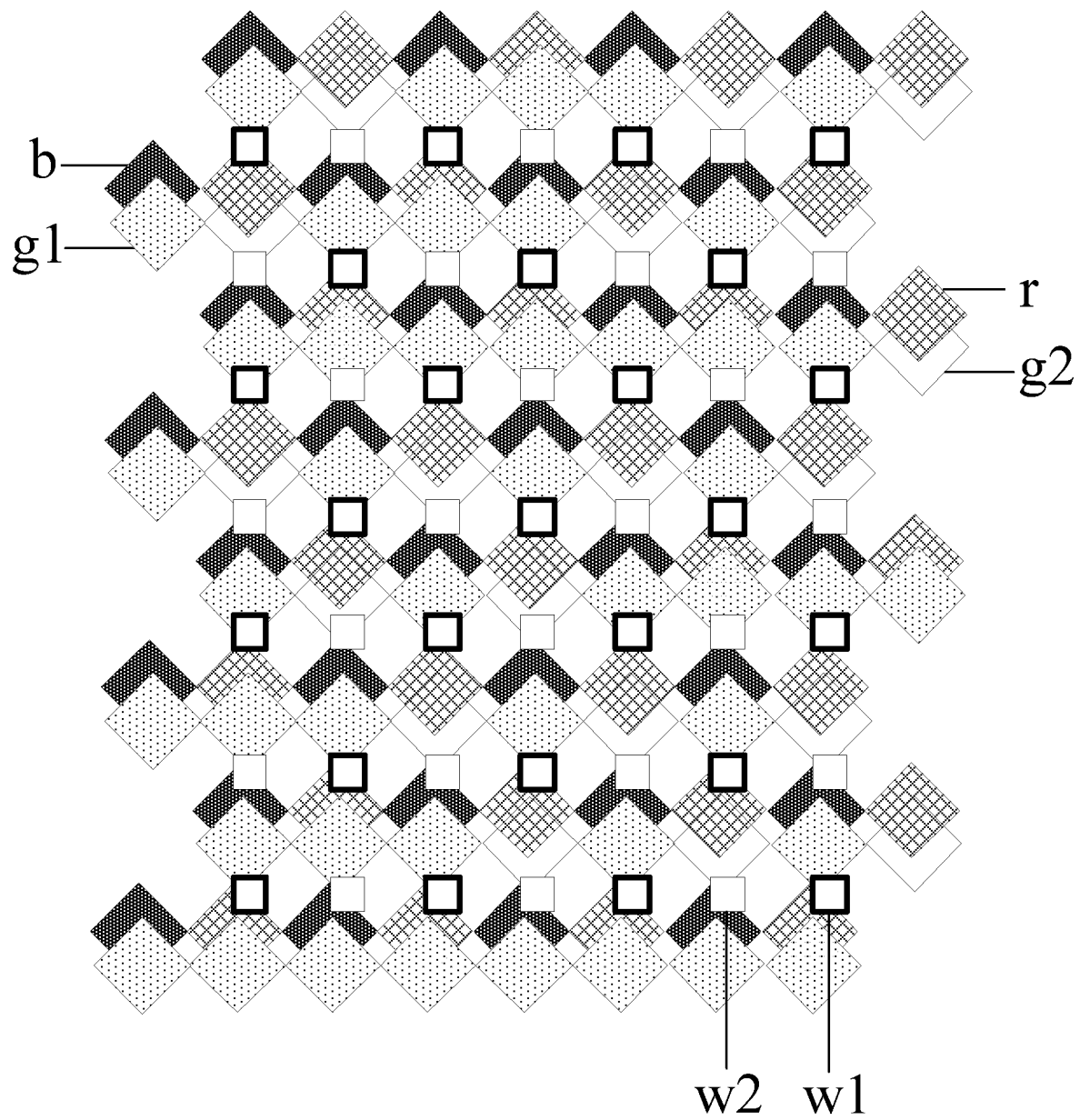
FIG. 15a is a schematic diagram of a light mixing effect according to an embodiment of the present disclosure.
Figure 15B:
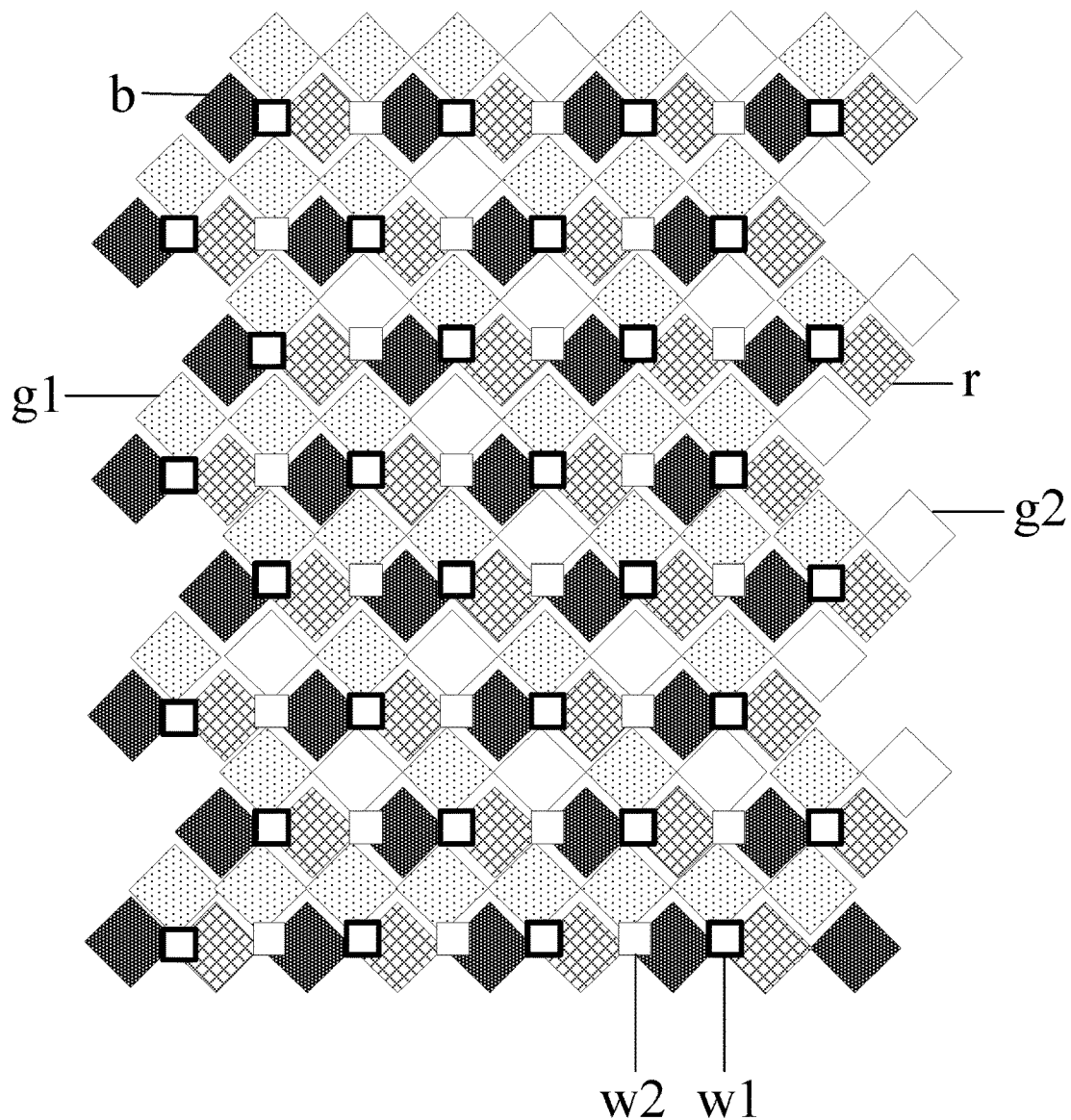
FIG. 15b is a schematic diagram of a light mixing effect according to an embodiment of the present disclosure.

FIG. 15a is a schematic diagram of a light mixing effect according to an embodiment of the present disclosure, and FIG. 15b is a schematic diagram of a light mixing effect according to an embodiment of the present disclosure.

As shown in FIG. 15a, in a case where the light mixing is performed on the pixel units of different colors in each pixel island group in a superimposition manner, the white dots w1 and w2 generated may be alternately arranged along the directions of rows and columns of the pixel units, respectively, so that the display resolution of the pixel island group is 7×7.

As shown in FIG. 15b, in a case where the light mixing is performed on the pixel units of different colors in each pixel island group in a staggered manner, the white dots w1 and w2 generated may be alternately arranged along the directions of rows and column of the pixel units, respectively, so that the display resolution of the pixel island group is 6×8.

Therefore, the positions of the white points generated after the light mixing can be adjusted by only adjusting the placement direction of the pixel units and using a proper light mixing mode, so that the display resolution is defined in a conventional manner, and actual use expectations are met.

Figure 16:
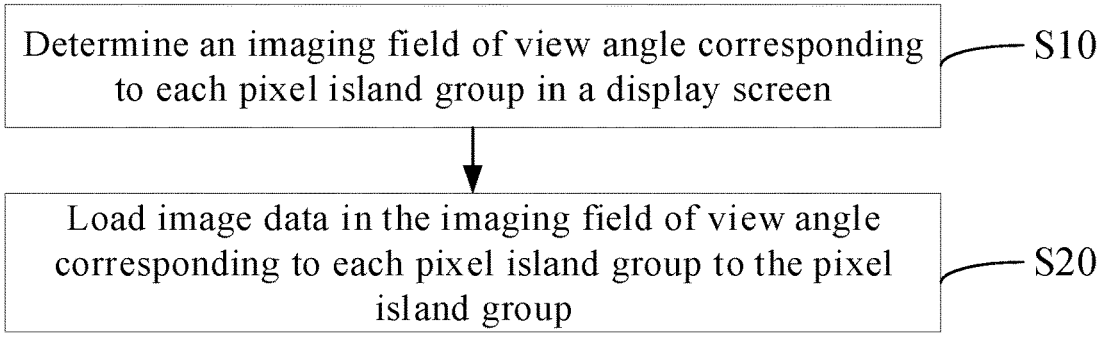
FIG. 16 is a flowchart of a display method for a near-eye display apparatus according to an embodiment of the present disclosure.

In another aspect, an embodiment of the present disclosure provides a display method for a near-eye display apparatus, and FIG. 16 is a flowchart of a display method for a near-eye display apparatus according to an embodiment of the present disclosure.

As shown in FIG. 16, the display method for the near-eye display apparatus includes following S10 to S20.

At S10, an imaging field of view angle corresponding to each pixel island group in a display screen is determined.

At S20, image data in the imaging field of view angle corresponding to each pixel island group is loaded to the pixel island group.

The display image of the display screen corresponds to a certain field of view angle. The embodiment of the present disclosure adopts the pixel islands to display the image, and the imaging field of view angles of the pixel island groups are continuous with each other, and each pixel island group is configured for displaying a partial image within a portion of the field of view angles. During displaying the image, an imaging field of view angle corresponding to each pixel island group in the display screen may be determined first, and then image data corresponding to the imaging field of view angle is loaded to the pixel units in the pixel island corresponding thereto, so that the image display can be achieved.

In specific implementations, for design convenience, the imaging field of view angles corresponding to the pixel island groups are equal, and the ranges of the imaging field of view angles of the pixel island groups adjacent to each other are continuous with each other. However, since the imaging lens group is disposed in the near-eye display apparatus, the field of view angle may be shifted, and thus the field of view angle can be shifted directly during loading the image data, so that the display image in the effective field of view is not to be deviated.

Specifically, each pixel island group includes at least a first pixel island and a second pixel island which are adjacent, the colors of the pixel units in the first pixel island are the same, the colors of the pixel units in the second pixel island are the same, the colors of the pixel units in the first pixel island and the second pixel island are different, the imaging field of view angle corresponding to the first pixel island is a first field angle, and the imaging field of view angle corresponding to the second pixel island is a second field angle.

In order to realize a full-color display, each pixel island group may generally include a red pixel island, a green pixel island and a blue pixel island, the red pixel island includes only red pixel units, the green pixel island includes only green pixel units, and the blue pixel island includes only blue pixel units. In principle, the imaging field of view angles of the pixel islands of different colors in the pixel island group are equal, so that the pixel islands can be imaged at the same position, and a color image can be fused. Due to the fact that the imaging lens group is arranged in the near-eye display apparatus, the imaging field of view has a certain shift, and in a case where the imaging field of view angles corresponding to the pixel islands are equal in size, the imaging field of view angles of the pixel islands adjacent to each other deviates from each other by a half of the imaging field of view angle. Therefore, in S20, loading the image data in the imaging field of view angle to the pixel island group includes: applying image data within a first imaging field of view angle to the first pixel island in each pixel island group; applying image data within a second field of view angle to the second pixel island in each pixel island group, the second field of view angle is obtained by shifting the first field of view angle by a half of the first field of view angle along a preset direction, and the preset direction is an arrangement direction along which the first pixel island and the second pixel island are arranged.

Specifically, in a case where the pixel islands are arranged in the arrangement rule shown in FIG. 6, the blue pixel island 20b and the red pixel island 20r are adjacent in the x direction, and thus the blue pixel island 20b and the red pixel island 20r can be regarded as the above-described first and second pixel islands adjacent to each other. According to principle analysis and simulation results, the offset between the imaging field of view angles of the pixel islands adjacent to each other can be determined to be a half of the field of view angle, so that if the imaging field of view angle of the blue pixel island 20b in the x direction ranges from −2° to 2°, the imaging field of view angle of the red pixel island 20r in the x direction ranges from 0° to −4°. Similarly, the blue pixel island 20b and the green pixel island 20g are adjacent in the y direction, and thus the blue pixel island 20b and the green pixel island 20g can be regarded as the above-described first and second pixel islands adjacent to each other. If the imaging field of view angle of the blue pixel island in the y direction ranges from −2° to 2°, the imaging field of view angle of the green pixel island 20g in the y direction ranges from −4° to 0°. During displaying the image, image data corresponding to the imaging field of view angle from −2° to 2° can be loaded to the blue pixel island 20b in the x direction and the y direction, image data corresponding to the imaging field of view angle from 0° to 4° can be loaded to the red pixel island 20r in the x direction, and image data corresponding to the imaging field of view angle from −4° to 0° can be loaded to the green pixel island 20g in the y direction, so that normal image display can be performed in the effective field of view in the dashed line box in FIG. 9, and for areas outside the dashed line box, the image data of the pixel units at corresponding positions can be controlled to be 0, so that the areas outside the dashed line box can display a black picture.

Although above embodiments of the present disclosure have been described, additional variations and modifications in these embodiments may be obvious to those skilled in the art once they learn of the basic inventive concepts. Therefore, it is intended that the appended claims be interpreted as including the described embodiments and all variations and modifications that fall within the scope of the present disclosure.

It will be apparent to those skilled in the art that various variations and modifications may be made in the embodiments of the present disclosure without departing from the spirit and scope of the embodiments of the present disclosure. Thus, if such modifications and variations of the embodiments of the present disclosure are within the scope of the claims of the present disclosure and their equivalents, the present disclosure is also intended to encompass such modifications and variations.

The invention claimed is:

1. A near-eye display apparatus, comprising:
    a display screen for displaying an image, the display screen comprising a plurality of pixel island groups, each pixel island group comprising at least one pixel island, and each pixel island comprising a plurality of pixel units;
    a micro-lens array disposed on a light-emitting side of the display screen, the micro-lens array comprising a plurality of micro-lenses, each micro-lens corresponding to one pixel island, each micro-lens being configured for imaging an image displayed by the pixel island corresponding thereto; and
    an imaging lens group disposed on a side of the micro-lens array away from the display screen and configured for collimating imaging light of the micro-lenses,
    wherein the pixel island groups are configured for displaying partial images respectively, and the partial images displayed by the pixel island groups form a complete image, imaging field of view angles formed by outgoing light rays, of the pixel island groups adjacent to each other, passing through the micro-lenses corresponding to the pixel island groups and the imaging lens group are continuous with each other.

2. The near-eye display apparatus of claim 1, wherein a distance between the pixel island and the micro-lens corresponding to the pixel island is less than a focal length of the micro-lens, and
    the image displayed by the pixel island is imaged by the micro-lens corresponding to the pixel island at a focal point of the imaging lens group.

3. The near-eye display apparatus of claim 1, wherein colors of the pixel units within each pixel island are the same, and colors of the pixel units within different pixel islands in each pixel island group are different,
    imaging field of view angles formed by outgoing light rays, of the pixel islands comprising the pixel units with a same color, passing through the micro-lenses corresponding to the pixel islands and the imaging lens group are continuous with each other.

4. The near-eye display apparatus of claim 3, wherein an intersection exists between the imaging field of view angles formed by the outgoing light rays, of the pixel islands adjacent to each other in each pixel island group, passing through the micro-lenses corresponding to the pixel islands and the imaging lens group.

5. The near-eye display apparatus of claim 4, wherein each of the pixel island groups comprises a same number of pixel islands, and the imaging field of view angles formed by the outgoing light rays of the pixel island groups passing through the micro-lenses corresponding to the pixel island groups and the imaging lens group are the same in size.

6. The near-eye display apparatus of claim 5, wherein an intersection between the imaging field of view angles of the pixel islands adjacent to each other in each pixel island group is a half of the imaging field of view angle of one of the pixel islands.

7. The near-eye display apparatus of claim 6, wherein two pixel islands adjacent to each other in each pixel island group are a first pixel island and a second pixel island, respectively, the first pixel island displays a first image, and the second pixel island displays a second image,
    a field of view angle corresponding to the first image is a first field of view angle, a field of view angle corresponding to the second image is a second field of view angle, a size of the first field of view angle is equal to a size of the second field of view angle, and the second field of view angle is obtained by shifting the first field of view angle along a preset direction by a half of the first field of view angle, and the preset direction is an arrangement direction along which the first pixel island and the second pixel island are arranged.

8. The near-eye display apparatus of claim 1, wherein each pixel island group comprises: a blue pixel island, a red pixel island, a first green pixel island and a second green pixel island, each pixel unit in the blue pixel island is blue, each pixel unit in the red pixel island is red, and each pixel unit in the first green pixel island and the second green pixel island is green,
    the blue pixel island, the red pixel island, the first green pixel island and the second green pixel island are arranged into a square array with two rows and two column, the blue pixel island and the red pixel island are located on one diagonal of the square array, and the first green pixel island and the second green pixel island are located on the other diagonal of the square array.

9. The near-eye display apparatus of claim 8, wherein the pixel units in each pixel island are arranged in an array, each pixel unit is rectangular, and a preset included angle is formed between an edge of each pixel unit and an arrangement direction along which the pixel units in each row are arranged.

10. The near-eye display apparatus of claim 9, wherein the preset included angle is about 45°.

11. The near-eye display apparatus of claim 1, wherein the pixel islands are the same in shape and size, and the micro-lenses are the same in shape and size.

12. The near-eye display apparatus of claim 1, wherein each micro-lens is one of a geometric lens, a super-lens, or an optical diffractive lens.

13. The near-eye display apparatus of claim 1, wherein the display screen is a silicon-based organic-light-emitting-diode display screen.

14. The near-eye display apparatus of claim 13, wherein a total number of the pixel units included in each unit area of the display screen ranges from 2000 to 3000.

15. The near-eye display apparatus of as claim 1, wherein the imaging lens group comprises at least one lens, and
    a surface shape of the lens in the imaging lens group is one of a spherical surface, an aspherical surface, a free-form surface or a super surface.

16. The near-eye display apparatus of claim 1, further comprising:
    a transparent substrate disposed between the display screen and the micro-lens array,
    the micro-lens array is disposed on a surface of the transparent substrate away from the display screen.

17. The near-eye display apparatus of claim 16, wherein a material of the transparent substrate is one of silicon nitride or polymethyl methacrylate.

18. The near-eye display apparatus of claim 1, wherein the micro-lens array is on a surface of the display screen on a light-emitting side thereof.

19. A display method for a near-eye display apparatus, comprising:
    determining an imaging field of view angle corresponding to each pixel island group in a display screen; and
    loading image data in the imaging field of view angle to the pixel island group corresponding to the imaging field of view angle.

20. The display method of claim 19, wherein the pixel island group comprises at least a first pixel island and a second pixel island adjacent to each other, colors of pixel units in the first pixel island are the same, colors of pixel units in the second pixel island are the same, and the colors of the pixel units in the first and the second pixel islands are different, the imaging field of view angle corresponding to the first pixel island is a first field angle, and the imaging field of view angle corresponding to the second pixel island is a second field angle,
    the loading image data in the imaging field of view angle to the pixel island group corresponding to the imaging field of view angle comprises:
    applying image data in the first field of view angle to the first pixel island in the pixel island group;
    applying image data in the second field of view angle to the second pixel island in the pixel island group,
    wherein the second field of view angle is obtained by shifting the first field of view angle by a half of the first field of view angle along a preset direction, and the preset direction is an arrangement direction along which the first pixel island and the second pixel island are arranged.

* * * * *